(12) United States Patent
Yoo

(10) Patent No.: US 9,557,360 B2
(45) Date of Patent: Jan. 31, 2017

(54) APPARATUS FOR ESTIMATING CAPACITANCE OF DC-LINK CAPACITOR IN INVERTER

(71) Applicant: LSIS CO., LTD., Anyang-si, Gyeonggi-do (KR)

(72) Inventor: Anno Yoo, Seoul (KR)

(73) Assignee: LSIS CO., LTD., Anyang-Si (KR)

(*) Notice: Subject to any disclaimer, the term of this patent is extended or adjusted under 35 U.S.C. 154(b) by 809 days.

(21) Appl. No.: 13/937,037

(22) Filed: Jul. 8, 2013

(65) Prior Publication Data

US 2014/0032145 A1 Jan. 30, 2014

(30) Foreign Application Priority Data

Jul. 26, 2012 (KR) ........................ 10-2012-0081992

(51) Int. Cl.
| | |
|---|---|
| *G01R 27/26* | (2006.01) |
| *H02M 7/49* | (2007.01) |
| *H02M 1/00* | (2006.01) |
| *G01R 31/42* | (2006.01) |

(52) U.S. Cl.
CPC ........... *G01R 27/26* (2013.01); *G01R 27/2605* (2013.01); *H02M 7/49* (2013.01); *G01R 31/42* (2013.01); *H02M 2001/0009* (2013.01)

(58) Field of Classification Search
None
See application file for complete search history.

(56) References Cited

U.S. PATENT DOCUMENTS 7,830,269 B2  11/2010  Cheng et al.

FOREIGN PATENT DOCUMENTS

| | | |
|---|---|---|
| CN | 2733369 | 10/2005 |
| CN | 102193042 | 9/2011 |
| JP | 05-308701 | 11/1993 |
| JP | 10-14097 | 1/1998 |
| JP | 2008-172910 | 7/2008 |
| JP | 2010-259165 | 11/2010 |
| KR | 20110014457 | 2/2011 |
| KR | 20110053795 | 5/2011 |
| WO | 2010/055556 | 5/2010 |

OTHER PUBLICATIONS

Abo-Khalil et al., DC-Link Capacitance Estimation in AC/DC/AC PWM Converters Using Voltage Injection, Sep./Oct. 2008, IEEE Transactions on Industry Applications, vol. 44 No. 5, 1631-1637.*

(Continued)

*Primary Examiner* — An Do
*Assistant Examiner* — Renee I Wilson
(74) *Attorney, Agent, or Firm* — Lee, Hong, Degerman, Kang & Waimey PC

(57) ABSTRACT

Disclosed herein is a capacitance estimation apparatus of a DC-link capacitance in an inverter. The apparatus according to the present invention may estimate a DC-link voltage, and compare it with a ripple size of the measured DC-link voltage to estimate a DC-link capacitance. According to the present invention, the capacitance of the DC-link capacitance contained in the inverter may be estimated in real time to detect the fault status in real time.

7 Claims, 4 Drawing Sheets

(56) References Cited

OTHER PUBLICATIONS

Lee et al., Online capacitance estimation of DC-Link electrolytic capacitors for three-phase AC/DC/AC PWM converters using recursive least squares method, Nov. 4, 2005, IEE PRoceedings—Electric Power Applications, vol. 152 Issue 6, 1503-1508.*
The State Intellectual Property Office of the People's Republic of China Application Serial No. 201310321022.3, Office Action dated May 28, 2015, 6 pages.
Japan Patent Office Application Serial No. 2013-153425, Office Action dated Apr. 22, 2014, 2 pages.
Korean Intellectual Property Office Application No. 10-2012-0081992, Office Action dated May 12, 2016, 4 pages.

* cited by examiner

APPARATUS FOR ESTIMATING CAPACITANCE OF DC-LINK CAPACITOR IN INVERTER

CROSS-REFERENCE TO RELATED APPLICATIONS

Pursuant to 35 U.S.C. §119(a), this application claims the benefit of earlier filing date and right of priority to Korean Application No. 10-2012-0081992, filed on Jul. 26, 2012, the contents of which is incorporated by reference herein in its entirety.

BACKGROUND OF THE INVENTION

1. Field of the Invention

The present disclosure relates to a capacitance estimation apparatus, and more particularly, to an apparatus for estimating a capacitance of a DC-link capacitor used in an inverter.

2. Description of the Related Art

Multi-level medium voltage inverter is an inverter with a line-to-line RMS voltage of greater than 600 V, which outputs a multi-level output phase voltage. The medium voltage inverter may used to drive a high capacity electromotor having a capacitance of several hundreds of kW to several tens of MW, and mainly used in the field of fans, pumps, compressors, tractions, hoists, conveyors, or the like.

Among the multi-level medium voltage inverters, series H-bridge inverters can be easily extended due to their modular structure, and thus mainly used for a medium voltage inverter. The series H-bridge inverter includes a high capacitance DC-link capacitor, but the DC-link capacitor has a problem of most likely causing a fault state.

SUMMARY OF THE INVENTION

A technical task of the present invention contrived to solve the foregoing problem is to provide a capacitance estimation apparatus in a DC-link capacitor of the inverter for estimating the capacitance of the DC-link capacitor in a unit power cell of the medium voltage inverter to determine the fault state of the DC-link capacitor, thereby facilitating the maintenance.

In order to solve the foregoing technical task, there is provided an apparatus for estimating a capacitance of a DC-link capacitor in an inverter having a rectifier unit, the DC-link capacitor and an inverter unit, and the apparatus may include a first estimation unit configured to estimate a DC-link voltage using a measured DC-link voltage, an output current of the inverter unit, and an output voltage of the inverter unit to output the estimated DC-link voltage; a calculation unit configured to calculate an evaluation index from the measured DC-link voltage and the estimated DC-link voltage; and a second estimation unit configured to estimate a DC-link capacitance using the evaluation index and an initial DC-link capacitance.

According to an embodiment of the present invention, the first estimation unit may include a first computation unit configured to compute output power using the output current and output voltage of the inverter unit; a third estimation unit configured to estimate DC-link power from the output power; a fourth estimation unit configured to divide the estimated DC-link power by an average of the DC-link voltage, and output the estimated DC-link voltage using the DC-link capacitance estimated by the second estimation unit; a second computation unit configured to compute an error between the measured DC-link voltage and the estimated DC-link voltage; and a first compensation unit configured to estimate input power from the error which is an output of the second computation unit by a proportional integral compensation.

According to an embodiment of the present invention, the third estimation unit may subtract the input power estimated by the compensation unit from the output power to estimate the DC-link power.

According to an embodiment of the present invention, the calculation unit may include a first band pass filter (BPF) configured to filter out a component corresponding to a second harmonic of the operating frequency of the estimated DC-link voltage; a first detection unit configured to detect a size of ripple voltage which is an output of the first BPF; a second band pass filter (BPF) configured to filter out a component corresponding to a second harmonic of the operating frequency of the measured DC-link voltage; a second detection unit configured to detect a size of ripple voltage which is an output of the second BPF; and a first comparison unit configured to divide the size of ripple voltage which is an output of the first detection unit by the size of ripple voltage which is an output of the second detection unit.

According to an embodiment of the present invention, the calculation unit may further include a band stop filter (BSF) configured to remove a component corresponding to a predetermined harmonic of the measured DC-link voltage.

According to an embodiment of the present invention, the fault status of the DC-link capacitor may be determined by the evaluation index.

According to an embodiment of the present invention, the second estimation unit may include a second comparison unit configured to output an error between the evaluation index and the reference value; a second compensation unit configured to estimate an error of the DC-link capacitance using an output of the second comparison unit by an integral compensation; and an addition unit to add an error estimated by the second compensation unit to the initial DC-link capacitance.

According to an embodiment of the present invention, the second estimation unit may further include a determination unit configured to determine the operation of the second estimation unit.

The foregoing present invention has an effect capable of estimating the capacitance of the DC-link capacitor contained in the inverter to simply detect the fault status in real time.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

As various modifications can be made and diverse embodiments are applicable to the present invention, specific embodiments will be illustrated with reference to the accompanying drawings and described in detail in the detailed description. However, those specific embodiments should not be construed to limit the present invention, and should be construed as being extended to all modifications, equivalents, and substitutes included in the concept and technological scope of the invention.

The terms including an ordinal number such as first, second, etc. can be used to describe various elements, but the elements should not be limited by those terms. The terms are used merely for the purpose to distinguish an element from the other element.

In case where an element is "connected" or "linked" to the other element, it may be directly connected or linked to the other element, but another element may be existed therebetween. On the contrary, in case where an element is "directly connected" or "directly linked" to another element, it should be understood that any other element is not existed therebetween.

It should be noted that the terms used herein are merely used to describe a specific embodiment, but not to limit the present invention. Incidentally, unless clearly used otherwise, expressions in the singular number include a plural meaning. In this application, the term "comprising," "including," or the like, intend to express the existence of the characteristic, the numeral, the step, the operation, the element, the part, or the combination thereof, and do not intend to exclude another characteristic, numeral, step, operation, element, part, or any combination thereof, or any addition thereto.

Hereinafter, a preferred embodiment of the present invention will be described in detail with reference to the accompanying drawings.

Figure 1:
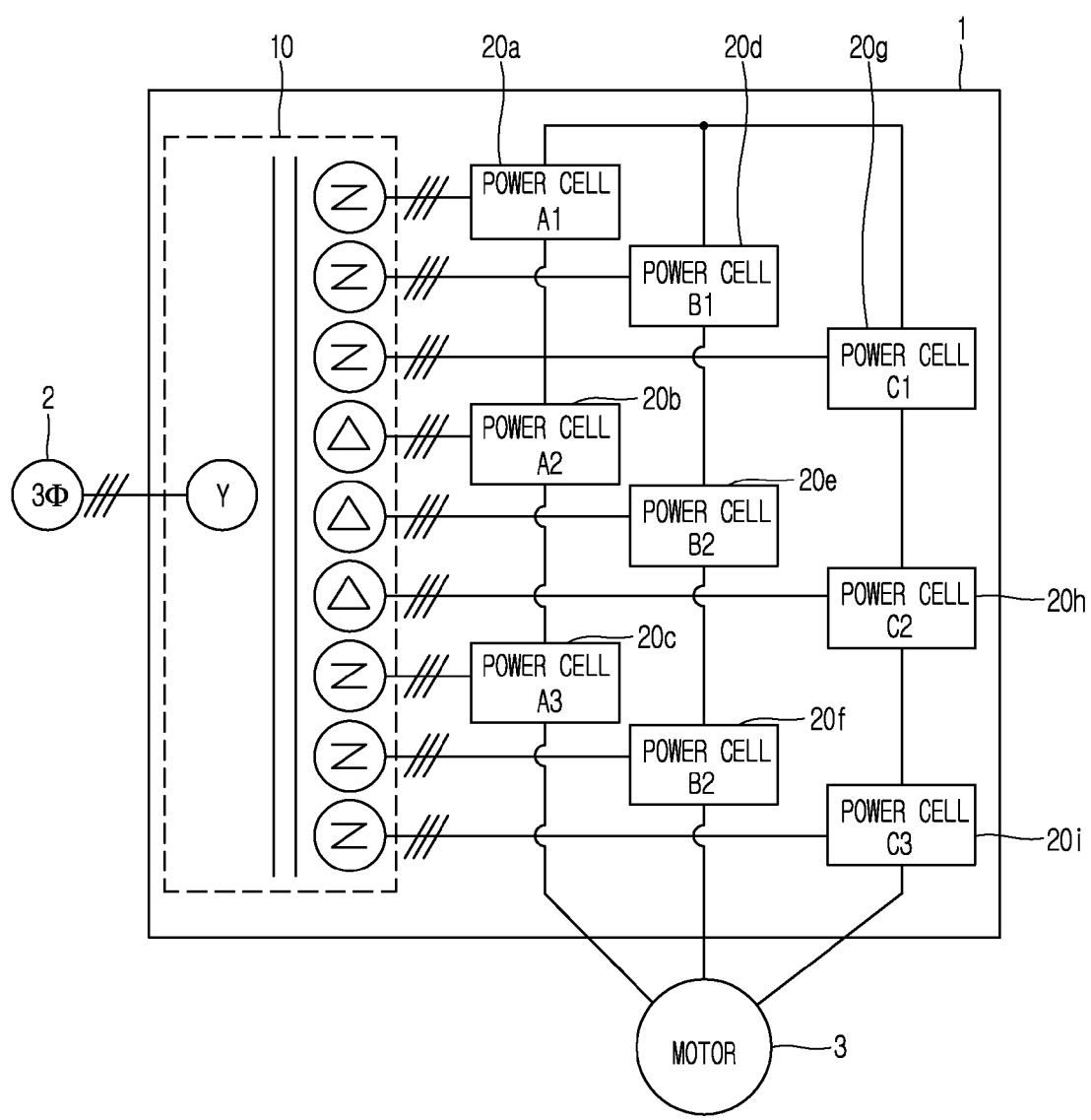
FIG. 1 is a configuration diagram illustrating a series H-bridge medium voltage inverter applied to an embodiment of the present invention.

FIG. 1 is a configuration diagram illustrating an in-series H-bridge medium voltage inverter applied to an embodiment of the present invention in which 3 stages of unit power cells are provided. However, the number of unit power cells is illustrated in an exemplary manner for the sake of convenience, and it should be understood by those skilled in the art that the number of unit power cells can be changed when the need arises.

As illustrated in the drawing, a medium voltage inverter 1 applied to the present invention may receive a line-to-line RMS voltage of greater than 600 V, and convert it into a 3-phase voltage and output the converted 3-phase voltage to the electromotor 3. The electromotor 3 is a medium voltage 3-phase electromotor, and may include an induction machine or synchronous machine, but may not be necessarily limited to this.

The medium voltage inverter 1 may include a phase shift transformer 10 and a plurality of unit power cells 20a to 20i.

The phase shift transformer 10 may provide a galvanic insulation between the input power 2 and the medium voltage inverter 1, and reduce the harmonics of the input terminal, and also provide input 3-phase power suitable to each unit power cell 20a to 20i.

The unit power cell 20a to 20i receive power from the phase shift transformer 10, and output a phase voltage of the electromotor 3. Each unit power cell is composed of three groups. In FIG. 1, the output voltages of the power cells (A1 to A3) 20a, 20b, 20c are connected in series to synthesize the a-phase voltages of the electromotor 3, and power cells (B1 to B3) 20d, 20e, 20f to synthesize the b-phase voltages of the electromotor 3, and power cells (C1 to C3) 20g, 20h, 20i to synthesize the c-phase voltages of the electromotor 3. The synthesized b-phase voltages and a-phase voltages have a phase difference of 120 degrees, and the c-phase voltages and b-phase voltages also have a phase difference of 120 degrees.

Figure 2:
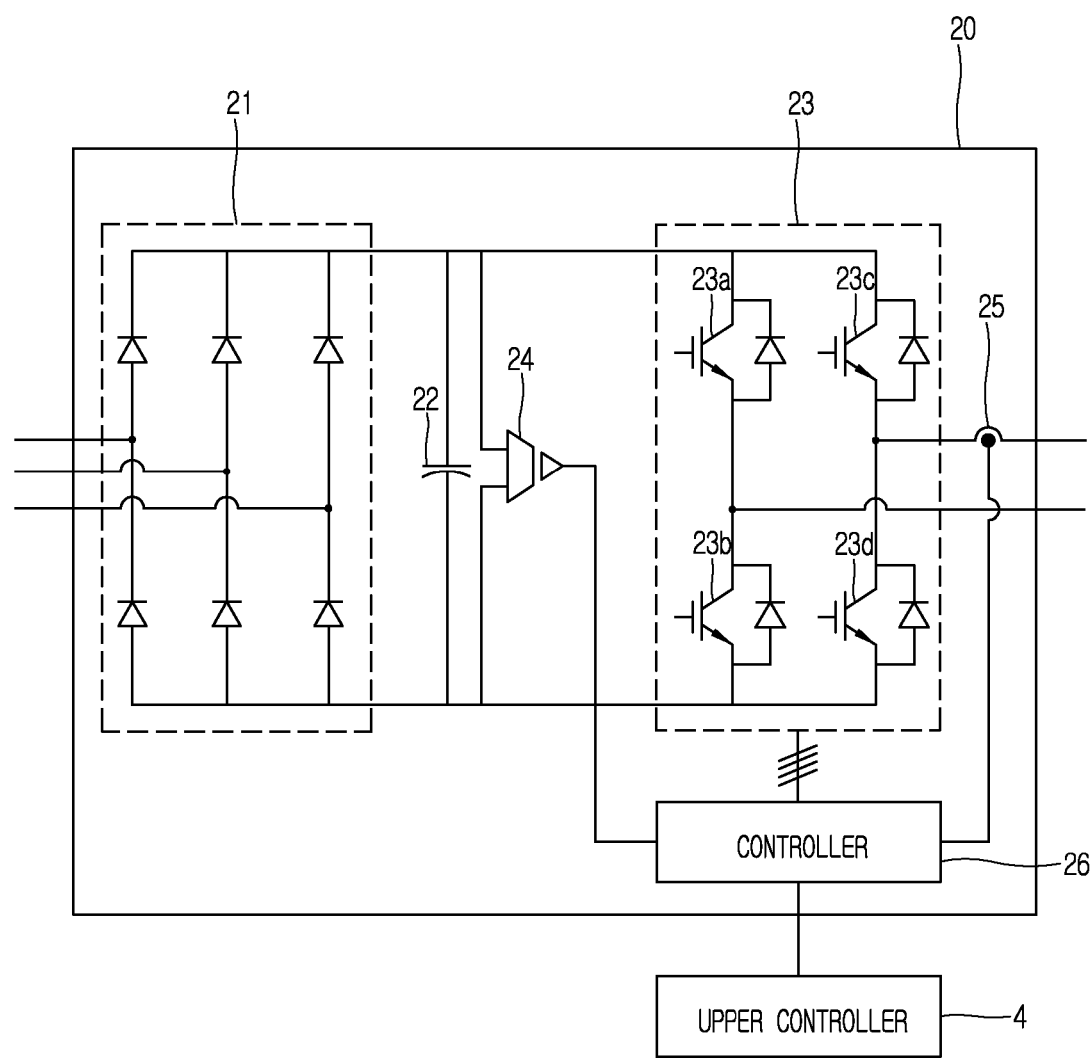
FIG. 2 is a structural diagram illustrating a unit power cell in FIG. 1.

FIG. 2 is a structural diagram illustrating a unit power cell in FIG. 1, and each unit power cell has the same structure, and thus is commonly referred to as reference numeral 20 for the description thereof.

As illustrated in the drawing, the unit power cell 20 of the high voltage inverter to which the present invention is applied may include a rectifier unit 21, a DC-link capacitor 22, an inverter unit 23, a voltage measurement unit 24, a current measurement unit 25, and a controller 26. The controller 26 is connected to the upper controller 4 through a communication line. The upper controller 4 is connected to the controller 26 of the each unit power cell 20 to 20i to transmit a control signal.

The rectifier unit 21 is a 3-phase diode rectifier, for example, and the input thereof is an output of the phase shift transformer 10 in FIG. 1, and the output thereof is DC power for which the input 3-phase voltage is rectified.

The DC-link capacitor 22 stores DC power rectified by the rectifier unit 21. The inverter unit 23 is a single phase full bridge inverter in FIG. 2, for example, and synthesizes the output voltages from the DC-link voltages under the control of the controller 26. However, the inverter unit 23 may not be necessarily limited to the single phase full bridge inverter, and the use of various types of inverters may be not excluded.

The voltage measurement unit 24 measures a DC-link voltage and the current measurement unit 25 measures an output current of the inverter unit 23.

The controller 26 controls the switching of each switch 23a to 23d of the inverter unit 23 using the measured voltage and current information.

Hereinafter, the operation of the foregoing medium voltage inverter in the related art will be described, and the operation of a capacitance estimation apparatus according to the present invention will be described.

The phase shift transformer 10 changes the phase and size of a high voltage to be suitable to the requirement of the unit power cell 20. In other words, the output voltage of the phase shift transformer 10 becomes an input voltage of the unit power cell 20, and the rectifier unit 21 converts it into a DC voltage.

The inverter unit 23 of the unit power cell 20 synthesizes AC output voltages from the DC-link voltages. If the DC-link voltage is defined as "E", then the output voltage of the inverter unit 23 may be defined as three levels such as "E", "0" and "−E". The output voltage is synthesized into "E" if the switches 23a and 23d of the inverter unit in FIG. 2 are conducted, and the output voltage is synthesized into "−E" if the switches 23b and 23c are conducted, and the output voltage is synthesized into "0" if the switches 23a and 23c or 23b and 23d are conducted.

Referring to FIG. 1, three unit power cells are connected in series for each phase of the unit power cell 20, and thus the series connected output phase voltages may be synthesized into seven levels such as "3E", "2E", "E", "0", "-E", "-2E" and "-3E", and furthermore, the output line-to-line voltage of the electromotor 3 may be synthesized into 13 levels such as "6E, "5E", "4E", "3E", "2E", "E", "0", "-E", "-2E", "-3E", "-4E", "-5E" and "-6E" from the synthesized output phase voltages.

It is illustrated in the following equation.

$$m = 2H+1 \qquad \text{[Equation 1]}$$

$$p = 2m-1 = 4H+1 \qquad \text{[Equation 2]}$$

Here, "m" is a number of levels of the output phase voltage, "H" is a number of unit power cells installed for each phase of the electromotor, and "p" is a number of levels of the output line-to-line voltage.

The inverter unit 23 of each unit power cell 20 has a single phase full bridge inverter structure, and thus the following voltage ripple exists in the DC-link power.

First, the output voltage and output current of each unit power cell 20 are defined as follows.

$$v_0 = \sqrt{2} V_0 \sin \omega t \qquad \text{[Equation 3]}$$

$$i_0 = \sqrt{2} I_0 \sin(\omega t - \phi) \qquad \text{[Equation 4]}$$

Here, $\phi$ is load angle, $\omega$ is operating frequency, "t" is time, and $V_0$ and $I_0$ are RMS values for output voltage and output current. The output power of the unit power cell 20 is given below from Equations 3 and 4.

$$p_0 = v_0 i_0 = V_0 I_0 \cos \phi - V_0 I_0 \cos(2\omega t - \phi) \qquad \text{[Equation 5]}$$

As shown in Equation 5, it is seen that the output power of the unit power cell 20 is divided into a DC component $V_0 I_0 \cos \phi$ and a AC component $V_0 I_0 \cos(2\omega t-\phi)$, and also it is seen that the AC component has a ripple corresponding to two times of the operating frequency.

From the above equations, a current flowing through the DC-link can be obtained as follows.

$$i_{DC} = \frac{p_0}{v_{DC}} = \frac{V_0 I_0}{v_{DC}} \cos\phi - \frac{V_0 I_0}{v_{DC}} \cos(2\omega t - \phi) \qquad \text{[Equation 6]}$$

From Equations 5 and 6, it is seen that a ripple corresponding to two times of the operating frequency is generated at the DC-link. The capacitance of the DC-link capacitor 22 in the unit power cell 20 should be high to reduce the effect of the power ripple.

In other words, since the capacitance of the DC-link capacitor 22 has an effect on the power ripple, the capacitance reduction of the DC-link capacitor 22 exerts an effect on the ripple of the DC-link voltage.

As described above, the output voltage of the series H-bridge medium voltage inverter 1 is affected according to the size of a DC-link voltage of the unit power cell 20, and in case of FIG. 1, the output phase voltage of the unit power cell 20 has seven levels such as "3E", "2E", "E", "0", "-E", "-2E" and "-3E". However, the size of the output phase voltage is instantly changed when the capacitance of the DC-link capacitor 22 is decreased, and thus it is unable to output a stable voltage, and consequently, the capacitance of the DC-link capacitor 22 is required to be estimated in real time.

The typical failure range of an electrolytic capacitor mainly used for the DC-link capacitor in a medium voltage inverter is a case where there occurs a capacitance change of 15-20%. The failure occurs due to thermal, electrical, mechanical, environmental factors, and thermal increase due to an evaporation of electrolytic solution and an increase of ripple current exerts a greater effect on the failure.

Furthermore, the capacitance of the capacitor is decreased, and the equivalent series resistance (ESR) is increased, and the temperature is increased due to a reduction of ambient temperature, over voltage and effective contact area, thereby accelerating the evaporation of electrolytic solution.

However, a series H-bridge medium voltage inverter in the related art does not estimate a capacitance of the DC-link capacitor 22, and thus it is difficult to determine the fault status. In particular, when the DC-link capacitor 22 causes an aging change, the capacitance of the capacitor 22 is decreased to generate a large voltage ripple of the DC-link voltage, and thus a ripple occurs at the output voltage of the medium voltage inverter 1, thereby causing a reduction of the driving performance of the electromotor 3.

In order to prevent the performance reduction, the capacitance of the DC-link capacitor 22 should be periodically measured, but to this end it should be measured in a state that the relevant unit power cell is separated from the entire system, thus causing a problem in that the entire system is periodically suspended or the output thereof should be reduced.

According to the present invention, the capacitance of the DC-link capacitor 22 contained in the unit power cell 20 is estimated in real time to detect the fault status in real time. According to the present invention, the unit power cell 20 is not required to be separated from the system to estimate the capacitance of the DC-link capacitor 22, thereby facilitating the maintenance.

It has been described that a capacitance estimation apparatus according to the present invention is applied to a medium voltage inverter system and a unit power cell thereof as illustrated in FIGS. 1 and 2, but may not be necessarily limited to this. In other words, it should be understood by those skilled in the art that the present invention can be used for an inverter with various voltage ranges in addition to the medium voltage inverter.

Figure 3:
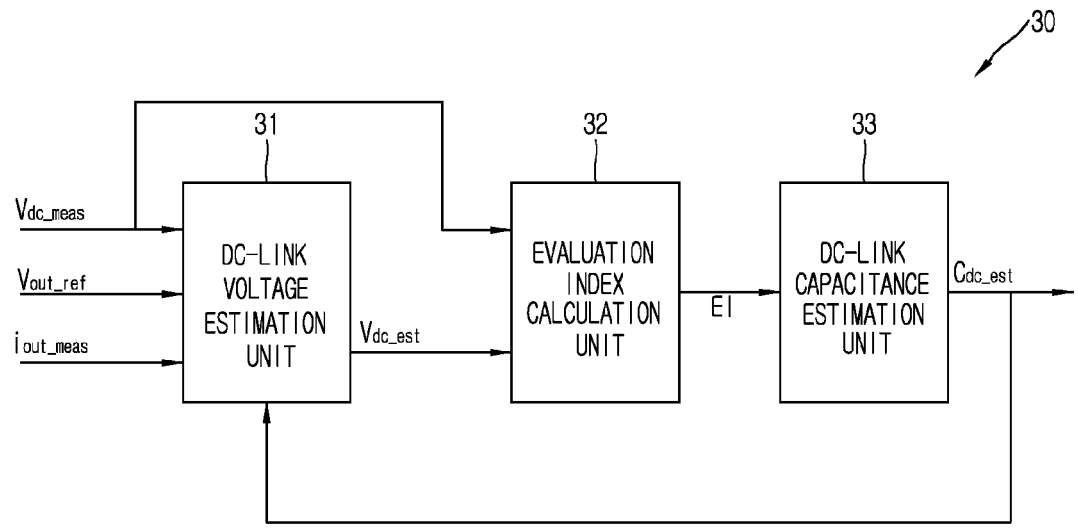
FIG. 3 is a configuration diagram illustrating a capacitance estimation apparatus of the DC-link capacitor in an inverter according to an embodiment of the present invention.

FIG. 3 is a configuration diagram illustrating a capacitance estimation apparatus of the DC-link capacitor in an inverter according to an embodiment of the present invention, which is applied to the controller 26 of the unit power cell in FIG. 2.

As illustrated in the drawing, an estimation apparatus 30 according to the present invention may include a DC-link voltage estimation unit 31, an evaluation index calculation unit 32, and a DC-link capacitance estimation unit 33.

The estimation apparatus 30 according to the present invention receives a DC-link voltage ($V_{dc\_meas}$) measured from the voltage measurement unit 24 and current measurement unit 25 and an output current ($i_{out\_ref}$) of the inverter unit 23 and an output voltage ($V_{out\_ref}$) of the inverter unit 23, which is a command voltage of the controller 26, to output an estimated DC-link capacitance ($C_{dc\_est}$) and an evaluation index (EI). Each constituent element will be described in detail.

Figure 4:
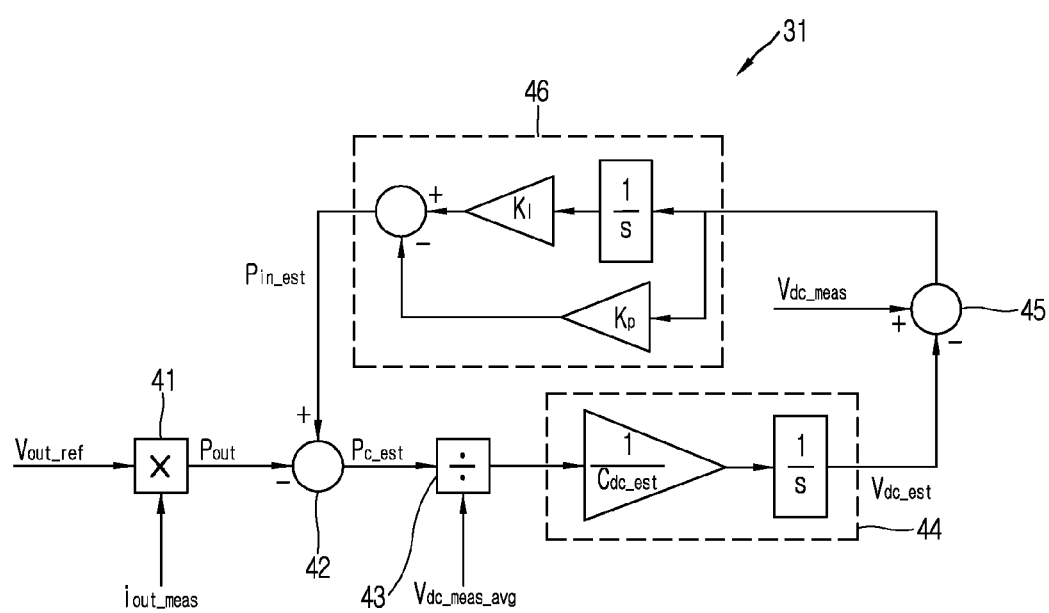
FIG. 4 is a detailed configuration diagram illustrating a DC-link voltage estimation apparatus in FIG. 3 according to an embodiment.

FIG. 4 is a detailed configuration diagram illustrating the DC-link voltage estimation apparatus 31 in FIG. 3 according to an embodiment.

As illustrated in the drawing, the DC-link voltage estimation unit 31 according to the present invention may include an output power computation unit 41, a DC-link power estimation unit 42, a DC-link current estimation unit 43, a DC-link voltage estimation unit 44, an error computation unit 45, and a compensation unit 46.

The output power computation unit 41 computes output power from the output current ($i_{out\_ref}$) and output voltage ($V_{out\_ref}$) of the inverter unit 23. The DC-link power estimation unit 42 estimates DC-link power from the output power and input power estimated by the compensation unit 46. The DC-link power is a value in which the output power is subtracted from the input power.

The DC-link current estimation unit 43 estimates a current flowing through the DC-link capacitor 22 from the estimated DC-link power.

The DC-link voltage estimation unit 44 estimates a DC-link voltage using the estimated DC-link current and a DC-link capacitance received from the DC-link capacitance estimation unit 33.

The error computation unit 45 computes an error between the estimated DC-link voltage and the measured DC-link voltage, and the compensation unit 46 estimates input power from the output of the error computation unit 45. The compensation unit 46 may be a proportional integral (PIP) compensator, for example. However, it may not be necessarily limited to this. Furthermore, the PI compensation method has been widely known, and thus the detailed description thereof will be omitted.

Figure 5:
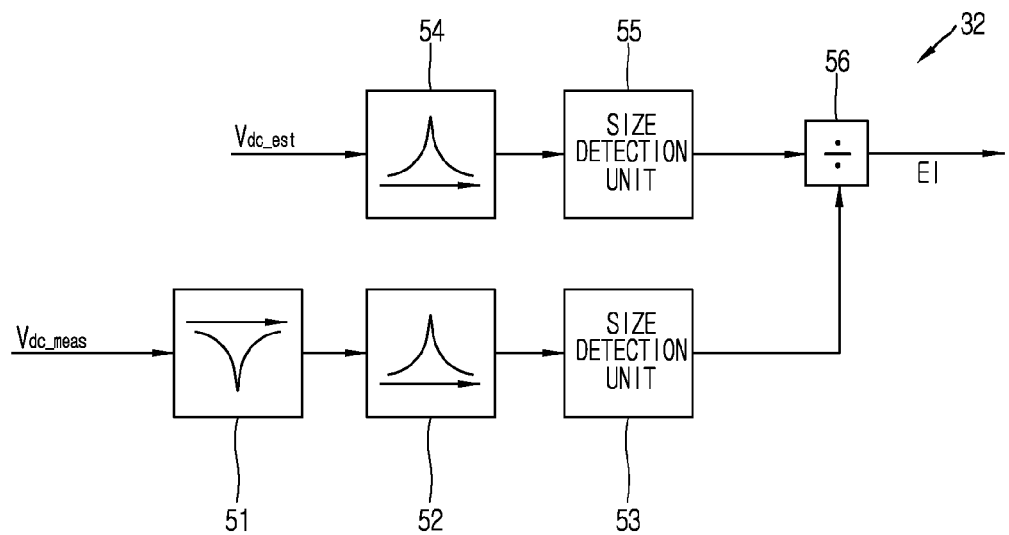
FIG. 5 is a detailed configuration diagram illustrating an evaluation index calculation unit in FIG. 3 according to an embodiment.

The evaluation index calculation unit 32 in FIG. 3 calculates an evaluation index from the DC-link voltage estimated by the DC-link voltage estimation unit 44 in FIG. 4 and the measured DC-link voltage. FIG. 5 is a detailed configuration diagram illustrating the evaluation index calculation unit 32 in FIG. 3 according to an embodiment.

As illustrated in the drawing, the evaluation index calculation unit 32 may include a band stop filter (BSF) 51, band pass filters (BPFs) 52, 54, size detection units 53, 55, and a comparison unit 56.

The band stop filter 51 outputs the measured DC-link voltage by removing a predetermined bandwidth from it, and the band pass filter 52 outputs only a desired bandwidth of the measured DC-link voltage from which the predetermined bandwidth is removed by selecting it.

The size detection units 53, 55 detect the sizes of the input voltages with a predetermined bandwidth, respectively, and the comparison unit 56 compares the outputs of the size detection units 53, 55 to output an evaluation index. The detailed description thereof will be described later.

Figure 6:
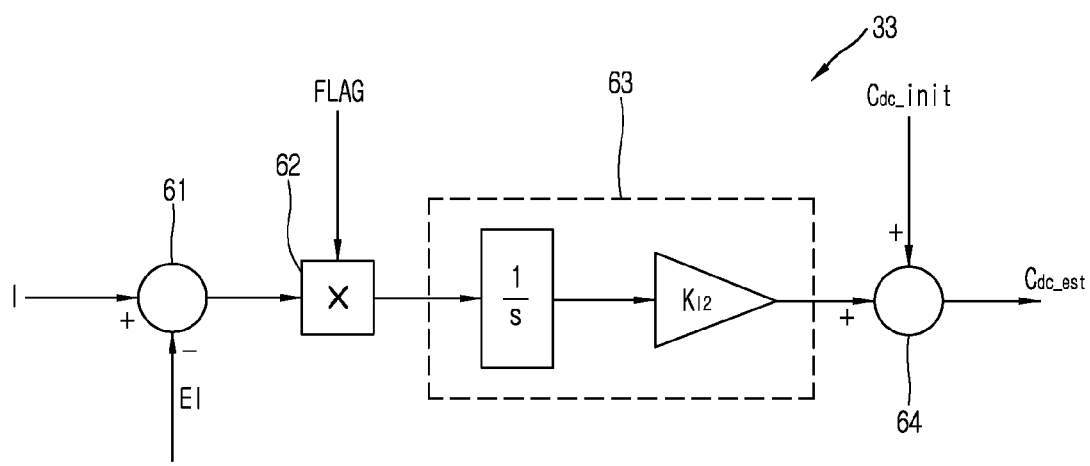
FIG. 6 is a detailed configuration diagram illustrating a DC-link capacitance estimation unit in FIG. 3 according to an embodiment.

FIG. 6 is a detailed configuration diagram illustrating the DC-link capacitance estimation unit 33 in FIG. 3 according to an embodiment.

As illustrated in the drawing, the DC-link capacitance estimation unit 33 according to the present invention may include a comparison unit 61, an operation determination unit 62, an error compensation unit 63, and an addition unit 64.

The comparison unit 61 compares the evaluation index (EI) which is an output of the comparison unit 56 in FIG. 5 with a reference value. The operation determination unit 62 determines the operation of the DC-link capacitance estimation unit 33. The error compensation unit 63 compensates an error of the DC-link capacitance estimation, and may be an integral compensator, for example, but it may not be necessarily limited to this. The operation of an integral compensator has been widely known, and thus the detailed description thereof will be omitted. The addition unit 64 adds an initial capacitance to the output of the error compensation unit 63 to output an estimated DC-link capacitance.

Hereinafter, the operation of FIGS. 3 through 6 will be described.

The output power of the inverter unit 23 in Equation 5 may be rewritten as in the following Equation 7.

$$P_{out} = v_0 i_0 = V_0 I_0 \cos \phi - V_0 I_0 \cos(2\omega t - \phi) \quad \text{[Equation 7]}$$

Here, $V_o$ is a size of output voltage, and $I_o$ is a size of output current, and $\phi$ is a phase angle of the output voltage and output current, and $\omega$ is a frequency of the output voltage and output current.

As shown in Equation 7, power generated from the inverter unit 23 shows a ripple corresponding to two times of the operating frequency.

Furthermore, the power of the DC-link capacitor 22 is as follows.

$$P_c = P_{in} - P_{out} = \frac{1}{2} C_{dc} \frac{dV_{dc}^2}{dt} \quad \text{[Equation 8]}$$

Here, $P_{in}$ denotes input power to the DC-link, and $P_{out}$ denotes output power from the DC-link to the inverter unit 23. The above Equation 8 can be approximated as follows.

$$P_c \cong C_{dc} V_{dc0} \frac{dV_{dc}}{dt} \quad \text{[Equation 9]}$$

Here, $V_{dc0}$ is an average of the DC-link voltage. From this, a DC-link voltage can be obtained as follows.

$$V_{dc} = \int \frac{P_c}{C_{dc} V_{dc0}} dt \quad \text{[Equation 10]}$$

FIG. 4 may be illustrated using the above equation. The output power computation unit 41 computes Equation 7, and the DC-link power estimation unit 42 computes Equation 8. The DC-link current estimation unit 43 and DC-link voltage estimation unit 44 implement Equation 10.

Input power may be estimated from the error computation unit 45 and compensation unit 46, and the transfer function of an actual DC-link voltage and an estimated DC-link voltage can be obtained as follows.

$$V_{dc\_est} = \frac{K_p s + K_I}{C_{dc\_est} V_{dc0} s^2 + K_p s + K_I} V_{dc} - \frac{s}{C_{dc\_est} V_{dc0} s^2 + K_p s + K_I} P_{out} \quad \text{[Equation 11]}$$

From the above Equation 11, it is seen that the DC-link voltage is the same as the actual DC-link voltage in a normal state.

The compensation unit 46 is a PI compensator, for example, and its gain may be chosen as follows, in a similar manner to a Butterworth filter.

$$K_p = 2\zeta \omega_n C_{dc\_est} V_{dc0} \quad \text{[Equation 12]}$$

$$K_I = C_{dc\_est} V_{dc0} \omega_n^2 \quad \text{[Equation 13]}$$

The evaluation index calculation unit 32 in FIG. 5 will be described below.

The evaluation index calculation unit 32 according to the present invention compares a DC-link voltage estimated by the DC-link voltage estimation unit 31 with a size of the actually measured DC-link voltage to calculate an evaluation index, and may be determined such that a capacitance change of the DC-link capacitor 22 is smaller as the evaluation index is closer to 1.

However, in order to determine only an effect due to the output of the inverter unit 23 in FIG. 2, signal processing is required to be carried out by the band stop filter 51, band pass filters 52, 54, and size detection units 53, 55. It may be carried out on the assumption that the output of the inverter unit 23 can be calculated in a more accurate manner when using the command voltage and measured current in FIG. 2.

As mentioned in Equation 5, a ripple corresponding to two times of the operating frequency occurs at the output power of the inverter unit 23, but this ripple current exerts an effect on the DC-link voltage. According to the present invention, only the size of the ripple power due to the output of the inverter unit 23 will be used for signal processing.

The band stop filter 51 removes a component corresponding to the sixth harmonic of the input frequency. A system using the rectifier unit 21 with a three-phase diode as illustrated in FIG. 2 generates ripple power corresponding to the sixth harmonic of the input power frequency all the time, but according to the present invention only the second harmonic of the output power frequency is taken into consideration, and thus filtering thereof is required.

The band pass filter 52 filters out a component corresponding to the second harmonic of the output power frequency shown at the measured DC-link voltage. The band pass filter 54 filters out a component corresponding to the second harmonic of the output power frequency shown at the estimated DC-link voltage.

Through the foregoing signal processing, it may be possible to extract or estimate a ripple voltage of the DC-link voltage due to ripple power occurring at the inverter unit 23.

The size detection units 53, 55 obtains the size of a ripple voltage. The size thereof is detected through the size detection units 53, 55 without directly using the output of the band pass filters 52, 54 is because an error due to the phase difference occurs when directly comparing it with a ripple voltage due to the ripple power.

The comparison unit 56 divides the size of the estimated ripple power by the size of the measured ripple power to determine an evaluation index. The range of the evaluation index may be selected in a suitable manner to determine the fault status of the DC-link capacitor 22 of the unit power cell 20.

The operation of the DC-link capacitance estimation unit 33 in FIG. 6 will be described below. The DC-link capacitance estimation unit 33 estimates the capacitance of the DC-link capacitor 22 using the evaluation index.

As described above, when the ripple size of the estimated DC-link voltage is the same as that of the measured DC-link voltage, the evaluation index becomes "1", and thus the DC-link capacitance estimation unit 33 according to the present invention calculates the capacitance of the DC-link capacitor 22 using such a property.

In other words, when a flag for determining the operation of the DC-link capacitance estimation unit 33 becomes "1", an error of the DC-link capacitance is estimated through the integral compensation of the error compensation unit 63. In this manner, the initial DC-link capacitance ($C_{dc\_init}$) is added to the estimated error to finally output the DC-link capacitance.

At this time, the initial DC-link capacitance may be an initially measured value or an initially designed nominal value.

According to the present invention, the DC-link voltage is estimated, and compared with the ripple size of the measured DC-link voltage to estimate the DC-link capacitance.

According to the present invention, the capacitance of the DC-link capacitor 22 contained in the unit power cell 20 is estimated in real time to detect the fault status in real time. Furthermore, the unit power cell 20 is not required to be separated from the system to estimate the capacitance of the DC-link capacitor 22, thereby facilitating the maintenance.

Although the present invention has been described with reference to the embodiments as illustrated in the drawings, these are merely illustrative, and it should be understood by those skilled in the art that various modifications and equivalent other embodiments of the present invention can be made. Consequently, the true technical protective scope of the present invention should be determined based on the technical concept of the appended claims.

The foregoing present invention has an effect capable of estimating the capacitance of the DC-link capacitor contained in the inverter to simply detect the fault status in real time.

What is claimed is:

1. An apparatus for estimating a capacitance of a DC-link capacitor in an inverter having a rectifier unit, the DC-link capacitor, and an inverter unit, the apparatus comprising:
    a first estimation unit configured to estimate a DC-link voltage using a measured DC-link voltage, an output current of the inverter unit, and an output voltage of the inverter unit to output the estimated DC-link voltage;
    a calculation unit configured to calculate an evaluation index from the measured DC-link voltage and the estimated DC-link voltage; and
    a second estimation unit configured to estimate a DC-link capacitance using the evaluation index and an initial DC-link capacitance,
    wherein the calculation unit comprises:
    a first band pass filter (BPF) configured to filter out a component corresponding to a second harmonic of the operating frequency of the estimated DC-link voltage;
    a first detection unit configured to detect a size of ripple voltage which is an output of the first BPF;
    a second band pass filter (BPF) configured to filter out a component corresponding to a second harmonic of the operating frequency of the measured DC-link voltage;
    a second detection unit configured to detect a size of ripple voltage which is an output of the second BPF; and
    a first comparison unit configured to divide the size of ripple voltage which is an output of the first detection unit by the size of ripple voltage which is an output of the second detection unit.

2. The apparatus of claim 1, wherein the first estimation unit comprises:
    a first computation unit configured to compute output power using the output current and output voltage of the inverter unit;
    a third estimation unit configured to estimate DC-link power from the output power;
    a fourth estimation unit configured to divide the estimated DC-link power by an average of the DC-link voltage, and output the estimated DC-link voltage using the DC-link capacitance estimated by the second estimation unit;

a second computation unit configured to compute an error between the measured DC-link voltage and the estimated DC-link voltage; and a first compensation unit configured to estimate input power from the error which is an output of the second computation unit by a proportional integral compensation.

3. The apparatus of claim 2, wherein the third estimation unit subtracts the input power estimated by the compensation unit from the output power to estimate the DC-link power.

4. The apparatus of claim 1, wherein the calculation unit further comprises:

a band stop filter (BSF) configured to remove a component corresponding to a predetermined harmonic of the measured DC-link voltage.

5. The apparatus of claim 1, wherein the fault status of the DC-link capacitor is determined by the evaluation index.

6. The apparatus of claim 1, wherein the second estimation unit comprises:

a second comparison unit configured to output an error between the evaluation index and the reference value;

a second compensation unit configured to estimate an error of the DC-link capacitance using an output of the second comparison unit by an integral compensation; and an addition unit to add an error estimated by the second compensation unit to the initial DC-link capacitance.

7. The apparatus of claim 6, wherein the second estimation unit further comprises:

a determination unit configured to determine the operation of the second estimation unit.

* * * * *